United States Patent
Danilov et al.

(10) Patent No.: US 10,331,516 B2
(45) Date of Patent: Jun. 25, 2019

(54) CONTENT-AWARE DATA RECOVERY METHOD FOR ELASTIC CLOUD STORAGE

(71) Applicant: EMC IP Holding Company LLC, Hopkinton, MA (US)

(72) Inventors: Mikhail Danilov, Saint Petersburg (RU); Konstantin Buinov, Kirovsk (RU); Kirill Gusakov, Saint Petersburg (RU); Sergey Koyushev, Saint Petersburg (RU); Maxim S. Trusov, Saint Petersburg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 23 days.

(21) Appl. No.: 15/636,454

(22) Filed: Jun. 28, 2017

(65) Prior Publication Data

US 2018/0181466 A1 Jun. 28, 2018

(30) Foreign Application Priority Data

Dec. 23, 2016 (RU) .................................. 2016150866

(51) Int. Cl.
| | |
|---|---|
| *G06F 11/00* | (2006.01) |
| *G06F 11/10* | (2006.01) |
| *H03M 13/15* | (2006.01) |
| *H03M 13/00* | (2006.01) |
| *G06F 3/06* | (2006.01) |
| *H03M 13/37* | (2006.01) |

(52) U.S. Cl.
CPC .......... *G06F 11/1076* (2013.01); *G06F 3/064* (2013.01); *G06F 3/067* (2013.01); *G06F 3/0608* (2013.01); *H03M 13/154* (2013.01); *H03M 13/373* (2013.01); *H03M 13/3761* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 2008/0221856 A1* | 9/2008 | Dubnicki | G06F 3/0608 703/21 |
| 2014/0380125 A1* | 12/2014 | Calder | G06F 11/10 714/766 |
| 2014/0380126 A1* | 12/2014 | Yekhanin | G06F 11/10 714/766 |

* cited by examiner

*Primary Examiner* — Daniel F. McMahon
(74) *Attorney, Agent, or Firm* — Womble Bond Dickinson (US) LLP

(57) ABSTRACT

A method for avoiding recovery and storage of useless data is disclosed. The operations comprise: determining that a subset of data fragments out of a plurality of data fragments have become unavailable, the plurality of data fragments forming a data chunk, wherein the plurality of data fragments are protected by additional redundancy data; determining whether all of data that were stored in the unavailable subset of data fragments when the unavailable subset of data fragments were available would be useless if recovered using remaining available data fragments of the data chunk and the redundancy data; and in response to determining that all of the data that were stored in the unavailable subset of data fragments would be useless if recovered, generating new redundancy data for protecting the remaining available data fragments of the data chunk without recovering the data that were stored in the unavailable subset of data fragments.

21 Claims, 8 Drawing Sheets

500

Determine whether all of one or more unavailable data fragments of a data chunk correspond only to useless data
510

↓

In response to determining that all of the one or more unavailable data fragments of the data chunk correspond only to useless data, generate redundancy data for protecting available data fragments of the data chunk without recovering content of the one or more unavailable data fragments
520

US 10,331,516 B2

CONTENT-AWARE DATA RECOVERY METHOD FOR ELASTIC CLOUD STORAGE

CROSS-REFERENCE TO RELATED APPLICATIONS

This application claims priority to Russian Patent Application No. 2016150866, filed Dec. 23, 2016, which is incorporated herein by reference in its entirety.

FIELD OF THE INVENTION

Embodiments of the disclosure are related to data storage, and more particularly, to a method, apparatus, and system for data recovery with erasure coding.

BACKGROUND

Cloud-based data storage solutions are becoming increasingly popular. One example is the Elastic Cloud Storage (ECS) service provided by Dell EMC. Latest trends in software architecture and development are used in these solutions to achieve outstanding scalability, availability, and serviceability.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure relate to a method, apparatus, and system for avoiding wasting resources on restoring and storing useless data.

Cloud-based data storage solutions are becoming increasingly popular. A cloud storage cluster may consist of multiple nodes. Each node may be associated with several (e.g., 15 to 120) storage devices (e.g., hard drives, etc.). Further, each node may run a number of services. Some of the services are cluster-level services. In one embodiment, all cluster-level functions may be distributed evenly between all cluster nodes. In particular, it is not guaranteed that a service that runs on a particular node owns data locations on storage devices connected to this node. Some other node or nodes may own these data locations.

In a cloud-based data storage system, data may be protected with an erasure coding approach. An erasure code is a forward error correction code for the binary erasure channel. Erasure coding has also been adapted for use as a data protection/recovery technique within data storage systems.

Figure 1:
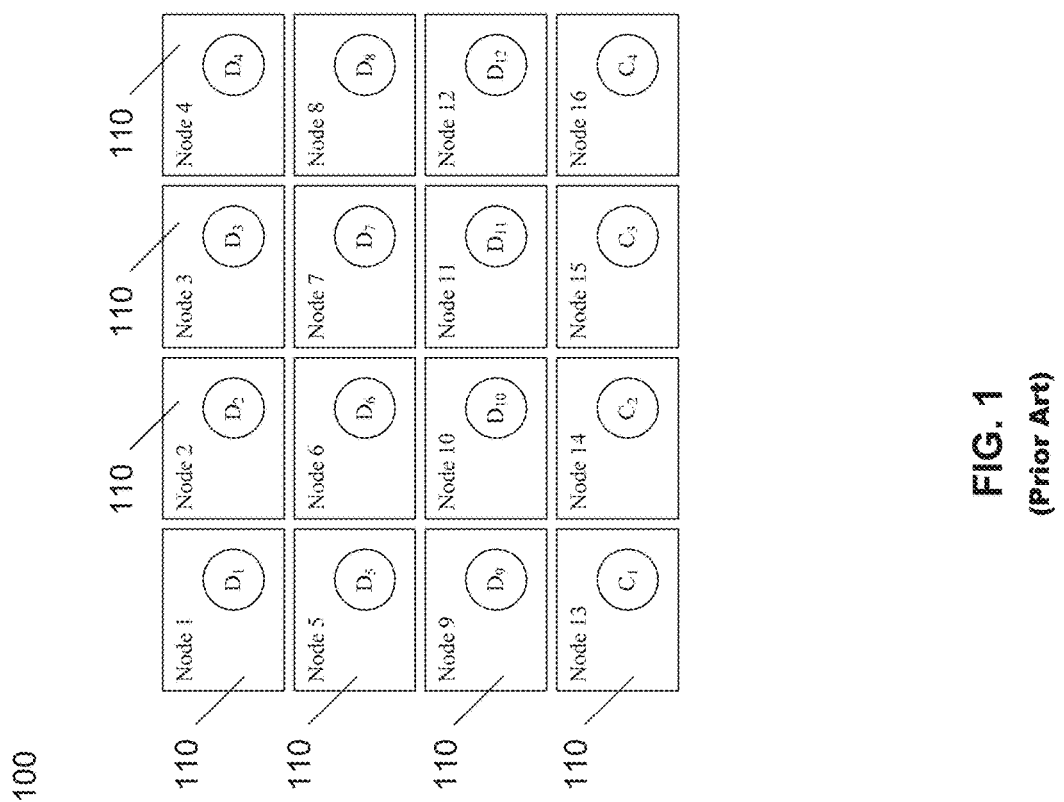
FIG. 1 is a diagram illustrating an example implementation of erasure coding in a data storage system.

Referring to FIG. 1, a diagram 100 illustrating an example implementation of erasure coding in a data storage system is shown. A data block (D) to be protected may be divided into k fragments. During encoding m redundant coding fragments may be created. Therefore, a total of k+m fragments may be stored. The known method of erasure coding ensures that the system can tolerate the loss of any m fragments in the k+m fragments (data and coding) stored. In other words, the missing or corrupt fragments can be recovered based on the remaining fragments as long as no more than m fragments are invalid. In one embodiment, the coding scheme may be 12+4, i.e. k equals to 12 and m equals to 4. In the example shown in FIG. 1, there are 16 nodes 110 (i.e., Node 1, Node 2 . . . Node 16) and 16 fragments (D1, D2 . . . D12, C1, C2, C3, and C4) to be stored. Each node may store just one fragment. In other embodiments (not shown), one node may contain several fragments. When some fragments are missing, the missing fragments may be restored via a decoding operation.

Figure 2:
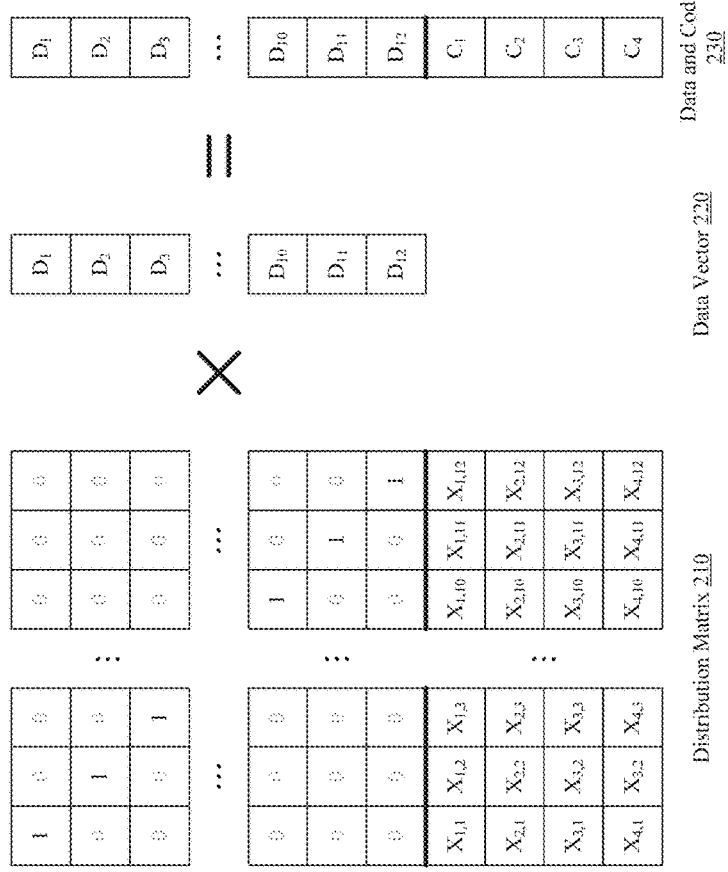
FIG. 2 is a diagram illustrating matrix-based erasure coding.

Referring to FIG. 2, a diagram 200 illustrating matrix-based erasure coding is shown. As shown in FIG. 2, k+m data and coding fragments are a matrix-vector product, where: a) The vector consists of k data fragments. b) The matrix is a so-called Distribution Matrix 210 of (k+m)×k size. The first k rows of the distribution matrix 210 compile a k×k identity matrix. The bottom m rows of the distributed matrix 210 are called the Coding Matrix. Coefficients $X_{i,j}$ are defined in a variety of ways depending on the erasure coding algorithm used.

During encoding, the distribution matrix 210 is multiplied by a data vector 220 and produces a product vector 230 containing both the data and the coding fragments. Thus, the encoding process boils down to m dot products of the coding matrix with the data. When some data fragments are lost, the missing fragments are restored using the same math but with a decoding matrix.

In one embodiment, all disk space may be partitioned into a set of blocks of a fixed size called chunks. The chunk size may be 128 Megabytes (MBs). All user data may be stored in these chunks and the chunks may be shared. One chunk may contain segments of several user objects. A reference table may be used to analyze the content of the chunk.

Figure 3:
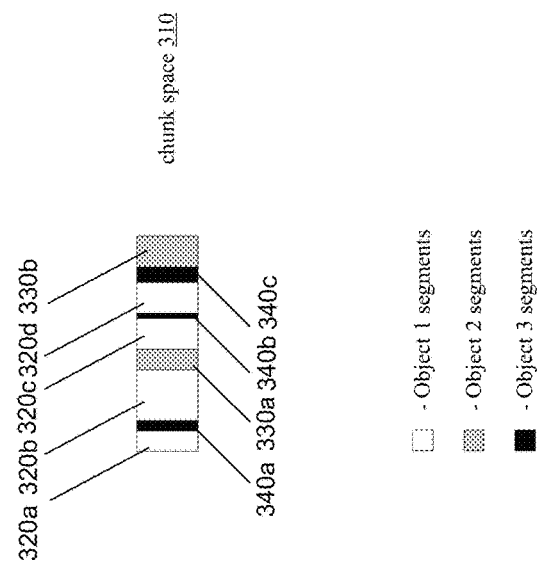
FIG. 3 is a diagram illustrating an example data chunk in a data storage system.

Referring to FIG. 3, a diagram 300 illustrating an example data chunk in a data storage system is shown. A chunk 310 may contain mixed segments of several user objects. As shown in FIG. 2, the chunk 210 may contain segments 320*a*, 320*b*, 320*c*, 320*d* that belong to Object 1, segments 330*a*, 330b that belong to Object 2, and segments 340a, 340b, 340c that belong to Object 3. A user data object may be stored as a set of segments that reside in several chunks. Chunk content may be modified in an append-only mode. When a chunk becomes full enough, it gets sealed. Content of sealed chunks is immutable. Sealed chunks may be protected with erasure coding.

When a chunk with user data loses one or several data fragments, content of these data fragments matters. Indeed, some storage use patterns imply massive data deletes. For instance, Apple tested ECS using the following pattern: 1) Write data (100%); and 2) Delete 75% of the data written after 3 months.

For this pattern and similar ones, there is a significant probability that some unavailable (e.g., missing, corrupt, etc.) data fragments contain no live data, i.e. these fragments correspond only to deleted user objects. If this is the case, a recovery process would restore useless data that would only waste storage capacity. On the other hand, a chunk with unavailable (e.g., missing, corrupt, etc.) data fragments needs to be recovered somehow. Otherwise, the chunk remains vulnerable.

Thus, embodiments of the disclosure are related to a chunk recovery method that a) would make sure the chunk content is protected but b) would not recover fragments that contains only useless data.

In one embodiment, the recovery process may first analyze content of, e.g., N unavailable data fragments using the reference tables. If all the N data fragments contain only useless data if recovered, the process may re-protect k-N data fragments of the chunk that are still available without recovering the N unavailable data fragments.

As the erasure coding scheme may require the same fixed number of data fragments (e.g., k data fragments) per chunk, predetermined fake data (e.g., all 1's, all 0's, etc.) may be used in the erasure coding-related processes (i.e., encoding and decoding) instead of the N data fragments' worth of useless data that would have been recovered.

It should be appreciated that the predetermined fake data are not stored on the storage device, therefore freeing up space. However, the storage system keeps track of them in its tables with system metadata. The predetermined fake data are predetermined known data (e.g., all 1's, all 0's, etc.) that are plugged into the erasure coding-related processes as needed.

Therefore, if all the unavailable data fragments of a chunk would contain only useless data if recovered, they may not be recovered, and the available data fragments of the chunk and the predetermined fake data are used to produce new m coding fragments using the standard encoding procedure described above. After the new coding fragments are stored in a non-volatile memory, the old coding fragments can be deleted.

Thus, content of data fragments with live data is protected but the generation of data fragments containing only useless data during recovery is reduced or eliminated. In the event that a protected data fragment becomes unavailable, the predetermined fake data may be used in the decoding procedure to restore the protected data fragment.

Figure 4A:
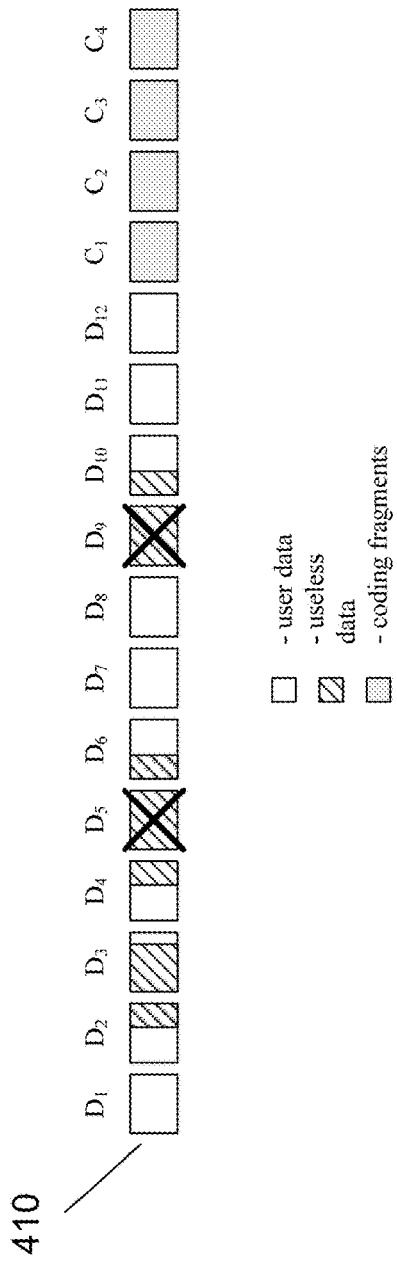
FIGS. 4A-4C are diagrams illustrating an example data chunk with which embodiments of the disclosure may be practiced.
Figure 4B:
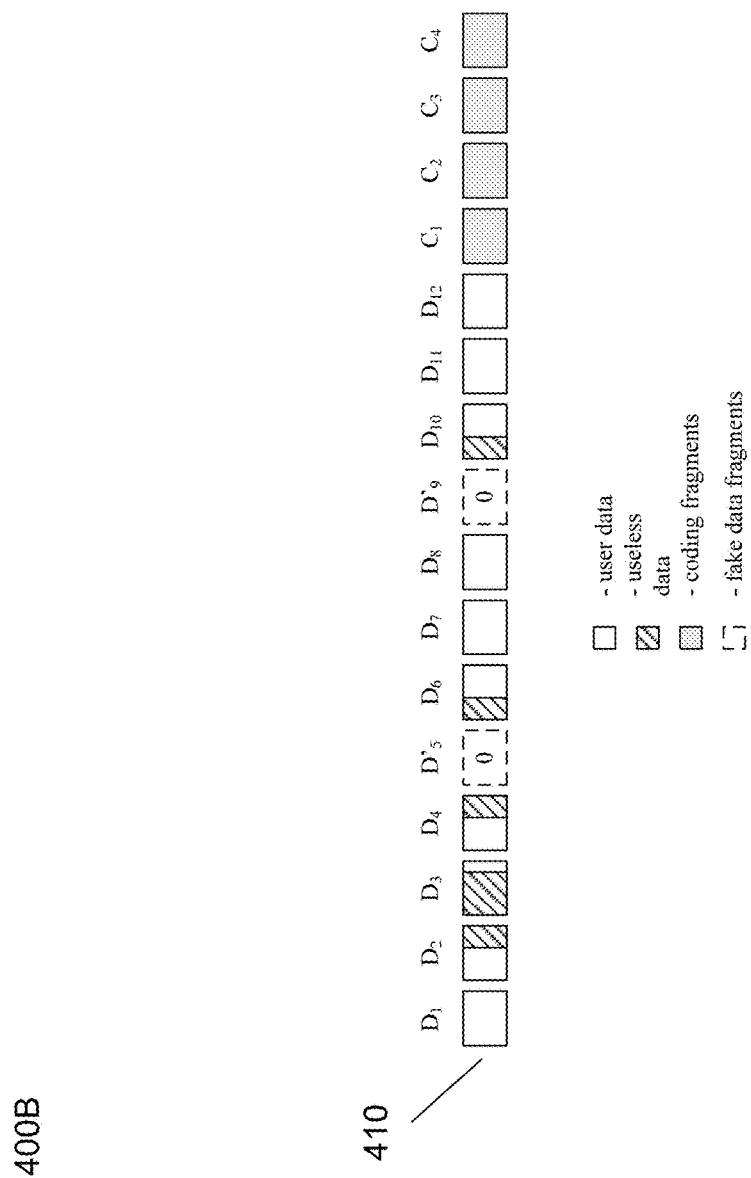
Figure 4C:
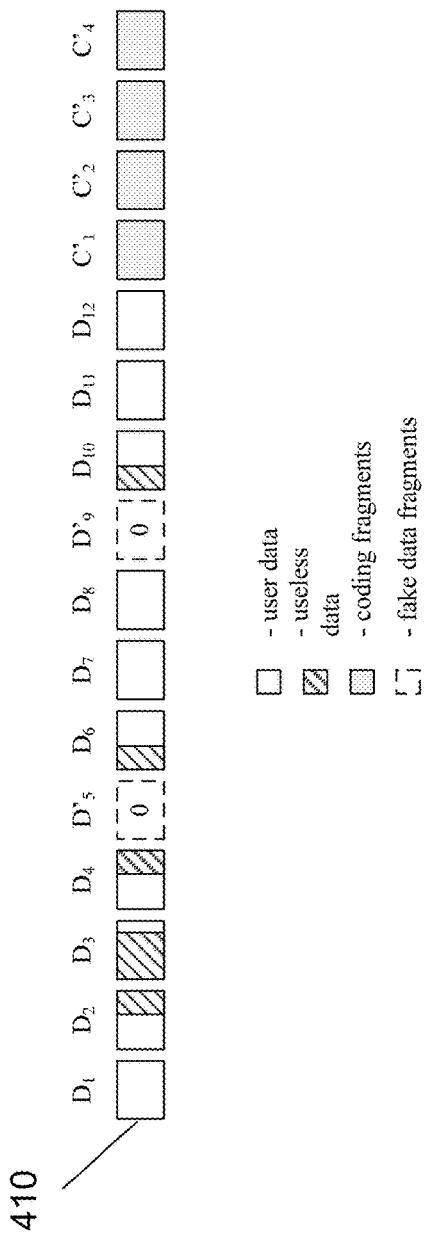

Referring to FIGS. 4A-4C, diagrams 400A-400C illustrating an example data chunk 410 with which embodiments of the disclosure may be practiced are shown. As shown in FIG. 4A, the two unavailable data fragments $D_5$ and $D_9$ of a data chunk 410 may contain only useless data.

As shown in FIG. 4B, next, predetermined fake data fragments $D'_5$ and $D'_9$ may be produced. It should be appreciated that the predetermined fake data fragments $D'_5$ and $D'_9$ may not be actually stored; they may be, however, tracked by the system with metadata in system tables.

Further, as shown in FIG. 4C, new coding fragments ($C'_1$-$C'_4$) may be generated based on the erasure coding scheme with available data fragments of the chunk and the predetermined fake data.

Therefore, all live user data may be protected again with new coding fragments without waste of storage capacity on useless data.

Figure 5:
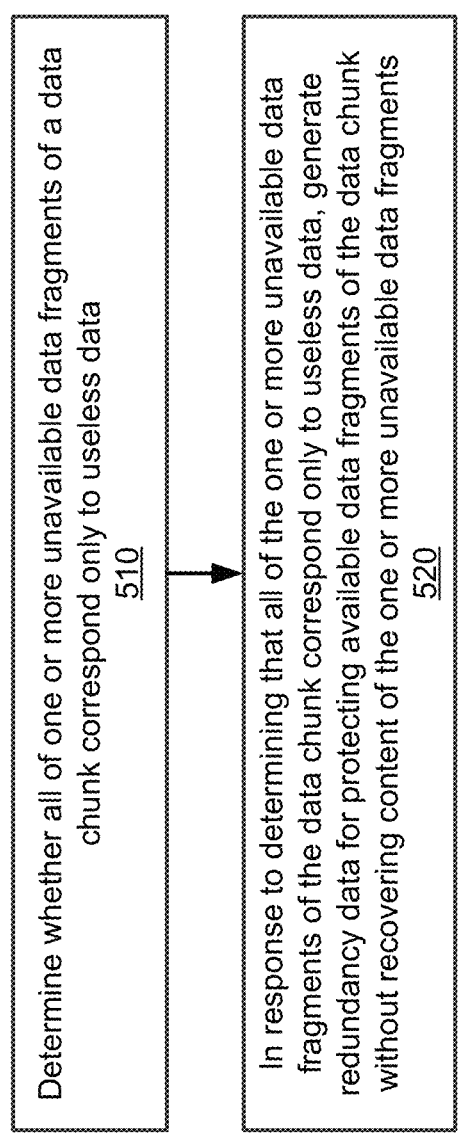
FIG. 5 is a flowchart illustrating an example method for avoiding recovery and storage of useless data.

Referring to FIG. 5, a flowchart illustrating an example method 500 for avoiding recovery and storage of useless data is shown. At block 510, it may be determined whether all of one or more unavailable data fragments of a data chunk correspond only to useless data. A data fragment corresponds only to useless data when all user objects associated with the data fragment have been deleted. Whether all of the one or more unavailable data fragments of the data chunk correspond only to useless data may be determined based on reference tables. At block 520, in response to determining that all of the one or more unavailable data fragments of the data chunk correspond only to useless data, redundancy data for protecting available data fragments of the data chunk may be generated without recovering content of the one or more unavailable data fragments. The redundancy data may be generated based on erasure coding. The redundancy data may be generated with predetermined fake data. The predetermined fake data may not be stored.

Method 500 may be performed by processing logic that includes hardware (e.g. circuitry, dedicated logic, etc.), software (e.g., embodied on a non-transitory computer readable medium), or a combination thereof. For example, method 500 may be performed by processors 1501 of FIG. 6. Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Therefore, according to the embodiments of the disclosure herein, in a storage system, before unavailable data fragments are recovered, it may be determined whether all the unavailable data fragments correspond only to useless data. If so, the recovery of the unavailable data fragments may be avoided to save computational resources and storage space. Predetermined fake data may be used instead of the useless data that would have been generated to create coding fragments that protect the available data fragments based on erasure coding.

Figure 6:
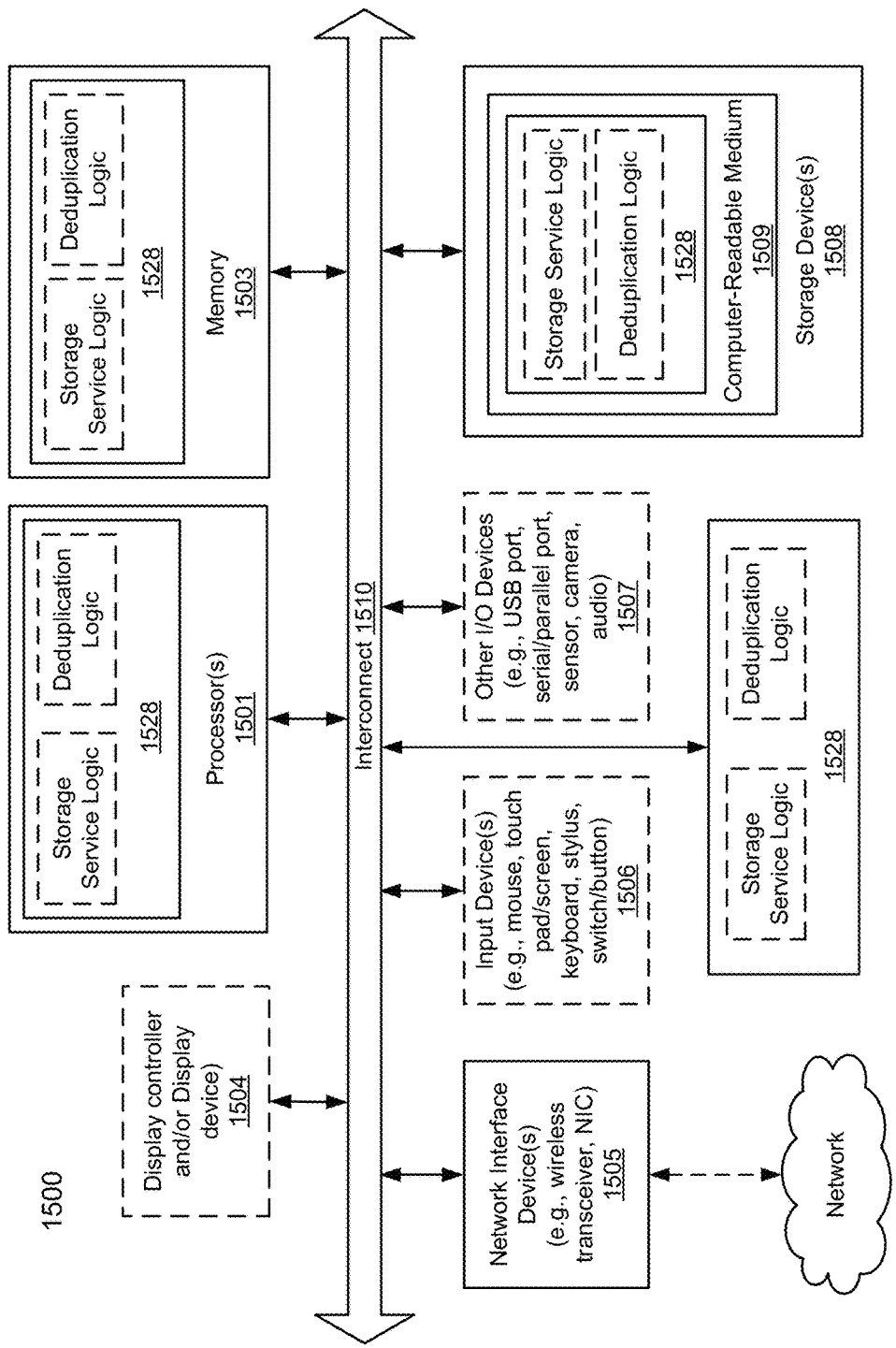
FIG. 6 is a block diagram illustrating an example of a data processing system which may be used with one embodiment of the disclosure.

FIG. 6 is a block diagram illustrating an example of a data processing system 1500 which may be used with one embodiment of the disclosure. For example, system 1500 may represents any of data processing systems described above performing any of the processes or methods described above. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including a basic input/output software (BIOS) as well as other firmware of the system.

Storage device 1508 may include computer-accessible storage medium 1509 (also known as a machine-readable storage medium or a computer-readable medium) on which is stored one or more sets of instructions or software (e.g., module, unit, and/or logic 1528) embodying any one or more of the methodologies or functions described herein. Module/unit/logic 1528 may also reside, completely or at least partially, within memory 1503 and/or within processor 1501 during execution thereof by data processing system 1500, memory 1503 and processor 1501 also constituting machine-accessible storage media. Module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Module/unit/logic 1528, components and other features described herein can be implemented as discrete hardware components or integrated in the functionality of hardware components such as ASICS, FPGAs, DSPs or similar devices. In addition, module/unit/logic 1528 can be implemented as firmware or functional circuitry within hardware devices. Further, module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for avoiding recovery and storage of useless data, comprising:
   determining that a subset of data fragments out of a plurality of data fragments have become unavailable, the plurality of data fragments forming a data chunk, wherein the plurality of data fragments are protected by additional redundancy data;
   determining whether all of data that were stored in the unavailable subset of data fragments when the unavailable subset of data fragments were available would be useless if recovered using remaining available data fragments of the data chunk and the redundancy data; and
   in response to determining that all of the data that were stored in the unavailable subset of data fragments would be useless if recovered, generating new redundancy data for protecting the remaining available data fragments of the data chunk without recovering the data that were stored in the unavailable subset of data fragments.

2. The method of claim 1, wherein determining whether all of the data that were stored in the unavailable subset of data fragments would be useless comprises determining whether all user objects associated with the unavailable subset of data fragments have been deleted.

3. The method of claim 1, wherein whether all of the data that were stored in the unavailable subset of data fragments would be useless is determined based on reference tables.

4. The method of claim 1, wherein the new redundancy data are generated based on erasure coding.

5. The method of claim 1, wherein the new redundancy data are generated in part with predetermined fake data, wherein the predetermined fake data is used whenever data from the unavailable subset of data fragments would be needed in the new redundancy data generation.

6. The method of claim 5, wherein the predetermined fake data are not stored.

7. The method of claim 5, wherein the predetermined fake data are one of: 1) all 0's, or 2) all 1's.

8. A non-transitory machine-readable medium having instructions stored therein which, when executed by a processor, cause the processor to perform data protection operations, the operations comprising:

determining that a subset of data fragments out of a plurality of data fragments have become unavailable, the plurality of data fragments forming a data chunk, wherein the plurality of data fragments are protected by additional redundancy data;

determining whether all of data that were stored in the unavailable subset of data fragments when the unavailable subset of data fragments were available would be useless if recovered using remaining available data fragments of the data chunk and the redundancy data; and in response to determining that all of the data that were stored in the unavailable subset of data fragments would be useless if recovered, generating new redundancy data for protecting the remaining available data fragments of the data chunk without recovering the data that were stored in the unavailable subset of data fragments.

9. The non-transitory machine-readable medium of claim 8, wherein determining whether all of the data that were stored in the unavailable subset of data fragments would be useless comprises determining whether all user objects associated with the unavailable subset of data fragments have been deleted.

10. The non-transitory machine-readable medium of claim 8, wherein whether all of the data that were stored in the unavailable subset of data fragments would be useless is determined based on reference tables.

11. The non-transitory machine-readable medium of claim 8, wherein the new redundancy data are generated based on erasure coding.

12. The non-transitory machine-readable medium of claim 8, wherein the new redundancy data are generated in part with predetermined fake data, wherein the predetermined fake data is used whenever data from the unavailable subset of data fragments would be needed in the new redundancy data generation.

13. The non-transitory machine-readable medium of claim 12, wherein the predetermined fake data are not stored.

14. The non-transitory machine-readable medium of claim 12, wherein the predetermined fake data are one of: 1) all 0's, or 2) all 1's.

15. A data processing system, comprising:
a processor; and
a memory coupled to the processor storing instructions which, when executed by the processor, cause the processor to perform data protection operations, the operations including:

determining that a subset of data fragments out of a plurality of data fragments have become unavailable, the plurality of data fragments forming a data chunk, wherein the plurality of data fragments are protected by additional redundancy data;

determining whether all of data that were stored in the unavailable subset of data fragments when the unavailable subset of data fragments were available would be useless if recovered using remaining available data fragments of the data chunk and the redundancy data; and in response to determining that all of the data that were stored in the unavailable subset of data fragments would be useless if recovered, generating new redundancy data for protecting the remaining available data fragments of the data chunk without recovering the data that were stored in the unavailable subset of data fragments.

16. The data processing system of claim 15, wherein determining whether all of the data that were stored in the unavailable subset of data fragments would be useless comprises determining whether all user objects associated with the unavailable subset of data fragments have been deleted.

17. The data processing system of claim 15, wherein whether all of the data that were stored in the unavailable subset of data fragments would be useless is determined based on reference tables.

18. The data processing system of claim 15, wherein the new redundancy data are generated based on erasure coding.

19. The data processing system of claim 15, wherein the new redundancy data are generated in part with predetermined fake data, wherein the predetermined fake data is used whenever data from the unavailable subset of data fragments would be needed in the new redundancy data generation.

20. The data processing system of claim 19, wherein the predetermined fake data are not stored.

21. The data processing system of claim 19, wherein the predetermined fake data are one of: 1) all 0's, or 2) all 1's.

* * * * *